United States Patent
Kudoh et al.

(10) Patent No.: US 12,466,984 B2
(45) Date of Patent: Nov. 11, 2025

(54) THERMALLY CONDUCTIVE SHEET AND METHOD FOR MANUFACTURING SAME

(71) Applicant: SEKISUI POLYMATECH CO., LTD., Saitama (JP)

(72) Inventors: Hiroki Kudoh, Kawaguchi (JP); Miho Ishihara, Ibaraki (JP)

(73) Assignee: SEKISUI POLYMATECH CO., LTD., Saitama (JP)

( * ) Notice: Subject to any disclaimer, the term of this patent is extended or adjusted under 35 U.S.C. 154(b) by 430 days.

(21) Appl. No.: 17/918,217

(22) PCT Filed: May 27, 2021

(86) PCT No.: PCT/JP2021/020297
§ 371 (c)(1),
(2) Date: Oct. 11, 2022

(87) PCT Pub. No.: WO2021/241714
PCT Pub. Date: Dec. 2, 2021

(65) Prior Publication Data
US 2023/0144307 A1 May 11, 2023

(30) Foreign Application Priority Data
May 29, 2020 (JP) .................. 2020-094786

(51) Int. Cl.
| | | |
|---|---|---|
| C09K 5/14 | (2006.01) |
| B32B 7/12 | (2006.01) |
| B32B 27/08 | (2006.01) |
| B32B 27/20 | (2006.01) |
| B32B 27/28 | (2006.01) |
| B32B 37/15 | (2006.01) |
| B32B 38/00 | (2006.01) |
| C08J 5/12 | (2006.01) |
| C08K 13/04 | (2006.01) |
| F28F 21/06 | (2006.01) |
| H05K 7/20 | (2006.01) |
| C08K 3/38 | (2006.01) |
| C08K 7/06 | (2006.01) |
| C08K 7/18 | (2006.01) |

(52) U.S. Cl.
CPC .............. *C09K 5/14* (2013.01); *B32B 7/12* (2013.01); *B32B 27/08* (2013.01); *B32B 27/20* (2013.01); *B32B 27/283* (2013.01); *B32B 37/15* (2013.01); *B32B 38/0004* (2013.01); *C08J 5/12* (2013.01); *C08K 13/04* (2013.01); *F28F 21/065* (2013.01); *H05K 7/20445* (2013.01); *B32B 2250/24* (2013.01); *B32B 2305/77* (2013.01); *B32B 2307/302* (2013.01); *B32B 2307/706* (2013.01); *B32B 2310/0831* (2013.01); *B32B 2383/00* (2013.01); *C08J 2383/05* (2013.01); *C08J 2383/07* (2013.01); *C08K 2003/385* (2013.01); *C08K 7/06* (2013.01); *C08K 7/18* (2013.01); *C08K 2201/001* (2013.01); *C08K 2201/014* (2013.01)

(58) Field of Classification Search
None
See application file for complete search history.

(56) References Cited

U.S. PATENT DOCUMENTS

| | | | |
|---|---|---|---|
| 6,660,395 B2* | 12/2003 | McGarry | ............. C08J 5/04 428/297.4 |
| 2010/0151231 A1 | 6/2010 | Matsuo et al. | |
| 2016/0104657 A1 | 4/2016 | Aramaki et al. | |
| 2020/0243414 A1* | 7/2020 | Kudoh | ............. C08L 101/00 |
| 2020/0317979 A1 | 10/2020 | Umetani | |
| 2021/0057304 A1 | 2/2021 | Koyano | |
| 2022/0018617 A1 | 1/2022 | Kudoh | |

FOREIGN PATENT DOCUMENTS

| | | |
|---|---|---|
| CA | 2008221 | 8/1990 |
| CN | 101688084 | 3/2010 |
| CN | 106566481 | 4/2017 |
| CN | 106905865 | 6/2017 |
| EP | 3 608 384 | 2/2020 |

(Continued)

OTHER PUBLICATIONS

Extended European Search Report issued May 7, 2024 in European Patent Application No. 21812243.0.

(Continued)

*Primary Examiner* — Sheeba Ahmed
(74) *Attorney, Agent, or Firm* — Wenderoth, Lind & Ponack, L.L.P.

(57) ABSTRACT

The present invention is a thermally conductive sheet comprising a plurality of unit layers, each comprising a silicone resin and a thermally conductive filler, the plurality of unit layers being laminated such that the plurality of unit layers are adhered to each other, wherein a volume content of the silicone resin is 32% by volume or less, and a compressive load at a sheet area of 25.4 mm×25.4 mm when the thermally conductive sheet is 30% compressed from a direction perpendicular to an adhesion plane on which the plurality of unit layers are adhered to each other is 7.0 kgf or less. According to the present invention, it is possible to improve the thermal conductivity and enhance the softness of a thermally conductive sheet using a silicone resin as a matrix component and composed of a large number of unit layers laminated as compared with the conventional one.

7 Claims, 3 Drawing Sheets

(56) References Cited

FOREIGN PATENT DOCUMENTS

| | | | |
|---|---|---|---|
| JP | 2009-66817 | 4/2009 | |
| JP | 2014-27144 | 2/2014 | |
| JP | 2019-38929 | 3/2019 | |
| JP | 6532047 B2 * | 6/2019 | ............... C08K 3/04 |
| WO | 2019/150944 | 8/2019 | |
| WO | 2019/160004 | 8/2019 | |
| WO | 2020/105601 | 5/2020 | |

OTHER PUBLICATIONS

International Search Report (ISR) issued Aug. 10, 2021 in International (PCT) Application No. PCT/JP2021/020297.

* cited by examiner

THERMALLY CONDUCTIVE SHEET AND METHOD FOR MANUFACTURING SAME

TECHNICAL FIELD

The present invention relates to a thermally conductive sheet and a method for producing the same.

BACKGROUND ART

In an electronic device such as a computer, an automotive part, or a cellphone, a heat-dissipating element such as a heat sink is generally used in order to dissipate heat generated from a heating element such as a semiconductor element or a machine part. It is known that a thermally conductive sheet is disposed between a heating element and a heat-dissipating element for the purpose of increasing the efficiency of heat transfer to the heat-dissipating element. The thermally conductive sheet is generally used by being compressed when disposed inside an electronic device, and needs to be highly soft.

The thermally conductive sheet generally contains a polymer matrix and a thermally conductive filler distributed in the polymer matrix. In addition, in the thermally conductive sheet, an anisotropic filler having anisotropy in shape may be oriented in one direction in order to enhance the thermally conductive property in a specific direction.

The thermally conductive sheet in which an anisotropic filler is oriented in one direction is produced, for example, by creating a plurality of primary sheets in which the anisotropic filler is oriented along the plane direction of the sheet by stretching or the like and perpendicularly slicing a product obtained by laminating and integrating a plurality of the primary sheets. According to this production method (hereinafter also referred to as the "flow orientation method"), a thermally conductive sheet composed of a large number of unit layers having a predetermined thickness laminated is obtained. In addition, the anisotropic filler can be oriented in the thickness direction of the sheet (see, for example, Patent Literature 1).

In addition, in the thermally conductive sheet, a silicone resin is widely used as the polymer matrix from the viewpoint of a thermally conductive property, heat resistance, and the like, and a thermally conductive filler such as an anisotropic filler is dispersed in the silicone resin, and the anisotropic filler is oriented in the thickness direction of the sheet to improve the thermal conductivity.

CITATION LIST

Patent Literature

PTL1: JP 2014-27144 A

SUMMARY OF INVENTION

Technical Problem

However, in recent years, the amount of heat generated has been increased with the advancement of an electronic device, and there is a need for a thermally conductive sheet having a higher thermal conductivity than conventionally from the viewpoint of requiring an excellent heat-dissipating property. From the viewpoint of improving the thermal conductivity, it can be considered to increase the content of the thermally conductive filler in the thermally conductive sheet (that is, reduce the content of a resin that serves as the matrix). In addition, a silicone resin can be used as the resin to provide a soft thermally conductive sheet. However, when a silicone resin is adopted as the resin, a problem is that it is difficult to produce a thermally conductive sheet from a composition (compound) in which a silicone resin to which a solvent is added is highly filled with a thermally conductive filler, and as a result, a thermally conductive sheet having a high thermal conductivity cannot be obtained.

In addition, it can also be considered to obtain a composition in which the silicone resin is highly filled with a thermally conductive filler using a volatile solvent or the like, but for example, the following problems may occur: it is difficult to laminate the primary sheets because of the influence of the volatile solvent, and the sheet is stiffened to impair the softness.

Accordingly, an object of the present invention is to improve the thermal conductivity and enhance the softness of a thermally conductive sheet using a silicone resin as a matrix component and composed of a large number of unit layers laminated as compared with the conventional one.

Solution to Problem

The present inventor has carried out a diligent study and as a result, found that the above object can be achieved by having the following configuration, completing the present invention. That is, the present invention provides the following [1] to [11].

[1] A thermally conductive sheet comprising a plurality of unit layers, each comprising a silicone resin and a thermally conductive filler, the plurality of unit layers being laminated such that the plurality of unit layers are adhered to each other, wherein a volume content of the silicone resin is 32% by volume or less, and a compressive load at a sheet area of 25.4 mm×25.4 mm when the thermally conductive sheet is 30% compressed from a direction perpendicular to an adhesion plane on which the plurality of unit layers are adhered to each other is 7.0 kgf or less.

[2] The thermally conductive sheet according to the above [1], wherein the plurality of unit layers are laminated along one direction along a plane direction of the sheet.

[3] The thermally conductive sheet according to the above [1] or [2], wherein the thermally conductive filler comprises an anisotropic filler.

[4] The thermally conductive sheet according to the above [3], wherein the thermally conductive filler further comprises a non-anisotropic filler.

[5] The thermally conductive sheet according to the above [3] or [4], wherein the anisotropic filler is oriented in a thickness direction of the sheet.

[6] The thermally conductive sheet according to any one of the above [3] to [5], wherein the anisotropic filler is at least one selected from the group consisting of a fibrous material and a flaky material.

[7] The thermally conductive sheet according to the above [6], wherein a normal direction of a flaky plane of the flaky material faces in a lamination direction of the plurality of unit layers.

[8] The thermally conductive sheet according to any one of the above [1] to [7], wherein the unit layers that are adjacent are firmly adhered directly to each other.

[9] A method for producing a thermally conductive sheet, comprising: a step (1) of forming a liquid composition comprising a curable silicone composition, a thermally conductive filler, and a volatile compound into a sheet shape to obtain a sheet-shaped formed product; a step (2) of curing the curable silicone composition while volatilizing a part of the volatile compound included in the sheet-shaped formed product in a state in which the sheet-shaped formed product is disposed between two films at least one of which is a gas-permeable film, to obtain a primary sheet; a step (4) of providing a plurality of the primary sheets and laminating the plurality of the primary sheets to adhere the plurality of the primary sheets to form a laminated block; and a step (5) of cutting the laminated block into a sheet shape along a lamination direction to obtain a thermally conductive sheet.

[10] A method for producing a thermally conductive sheet, comprising: a step (1) of forming a liquid composition comprising a curable silicone composition, a thermally conductive filler, and a volatile compound into a sheet shape to obtain a sheet-shaped formed product; a step (2') of curing the curable silicone composition while volatilizing a part of the volatile compound included in the sheet-shaped formed product, to obtain a primary sheet; a step (3) of providing a plurality of the primary sheets and irradiating at least one side of each of the primary sheets with a vacuum ultraviolet ray; a step (4') of laminating the plurality of the primary sheets such that the one side irradiated with the vacuum ultraviolet ray is in contact with another of the primary sheets to adhere the plurality of the primary sheets to form a laminated block; and a step (5) of cutting the laminated block into a sheet shape along a lamination direction to obtain a thermally conductive sheet.

[11] The method for producing a thermally conductive sheet according to the above [9] or [10], wherein the thermally conductive filler comprises an anisotropic filler, and the anisotropic filler is oriented along a plane direction of each of the primary sheets, and the laminated block is cut in a direction orthogonal to a direction in which the anisotropic filler is oriented.

Advantageous Effects of Invention

According to the present invention, it is possible to improve the thermal conductivity and enhance the softness of a thermally conductive sheet using a silicone resin as a matrix component and composed of a plurality of unit layers laminated as compared with the conventional one.

DESCRIPTION OF EMBODIMENTS

Hereinafter, the thermally conductive sheets according to embodiments of the present invention will be described in detail.

First Embodiment

Figure 1:
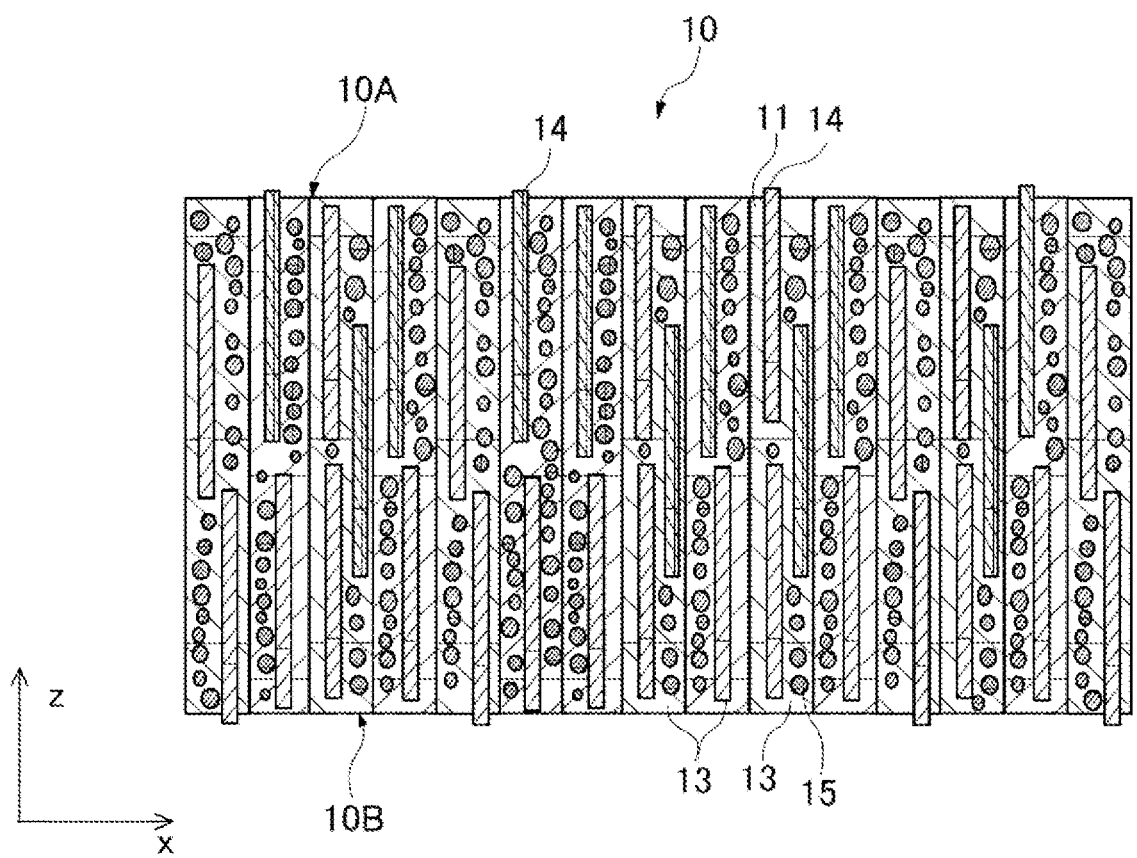
FIG. 1 is a schematic cross-sectional view showing a thermally conductive sheet of a first embodiment.

FIG. 1 shows a thermally conductive sheet of a first embodiment. The thermally conductive sheet 10 according to the first embodiment includes a plurality of unit layers 13, each containing a silicone resin 11 and a thermally conductive filler. The plurality of unit layers 13 are laminated in one direction along the plane direction (that is, one direction perpendicular to the thickness direction z, and also referred to as the "lamination direction x"), and the unit layers 13 that are adjacent are adhered to each other. In each of the unit layers 13, the silicone resin 11 serves as a matrix component that holds the thermally conductive filler, and the thermally conductive filler is blended into the silicone resin 11 in such a way as to be distributed.

The thermally conductive sheet 10 contains an anisotropic filler 14 and a non-anisotropic filler 15 as the thermally conductive filler. The anisotropic filler 14 is oriented in the thickness direction z of the sheet 10. The thermally conductive sheet 10 contains the anisotropic filler 14 that is oriented in the thickness direction z of the sheet, to improve the thermally conductive property in the thickness direction z. In addition, the thermally conductive property of the thermally conductive sheet 10 is also further improved by further containing the non-anisotropic filler 15.

In the thermally conductive sheet 10 of the present invention, the compressive load at a sheet area of 25.4 mm×25.4 mm when the thermally conductive sheet is 30% compressed from a direction perpendicular to an adhesion plane on which the plurality of unit layers are adhered to each other is 7.0 kgf or less. If the compressive load exceeds 7.0 kgf, the softness is insufficient, and it becomes difficult to compress and use the thermally conductive sheet 10 of the present invention inside an electronic device or the like.

From the viewpoint of improving the softness, the compressive load is preferably 5.0 kgf or less and more preferably 3.0 kgf or less. In addition, from the viewpoint of preventing each of the unit layers 13 from spreading because of the pressure when the unit layers are laminated during the production of the thermally conductive sheet 10 to appropriately produce the thermally conductive sheet 10, the compressive load is preferably 0.5 kgf or more.

The compressive load is measured when the thermally conductive sheet 10 is 30% compressed from a direction perpendicular to an adhesion plane on which the plurality of unit layers are adhered to each other, and specifically the thermally conductive sheet 10 may be compressed in the thickness direction of the thermally conductive sheet 10. In addition, 30% compression means compression by a thickness equivalent to 30% of the initial thickness of the thermally conductive sheet 10 before compression.

(Silicone Resin)

The silicone resin 11 is not particularly limited as long as it is an organopolysiloxane, and it is preferable to use a curable silicone resin. The silicone resin 11 when it is curable can be obtained by curing a curable silicone composition. As the silicone resin 11, an addition-reaction type or a type other than the same may be used. In the case of the addition-reaction type, the curable silicone composition preferably includes a silicone compound, which is the base resin, and a curing agent that cures the base resin.

The silicone compound used as the base resin is preferably an alkenyl group-containing organopolysiloxane, and specific examples thereof include a vinyl-both terminated organopolysiloxane such as vinyl-both terminated polydimethylsiloxane, vinyl-both terminated polymethylphenylsiloxane, a vinyl-both terminated dimethylsiloxane-diphenylsiloxane copolymer, a vinyl-both terminated dimethylsiloxane-phenylmethylsiloxane copolymer, or a vinyl-both terminated dimethylsiloxane-diethylsiloxane copolymer.

The curing agent is not particularly limited as long as it can cure the silicone compound, which is the base resin, described above, and is preferably a hydrogen organopolysiloxane, which is an organopolysiloxane having two or more hydrosilyl groups (SiH).

The hardness of the primary sheet described later can be adjusted by suitably adjusting the ratio of the amount of the curing agent blended to the amount of the base resin. Specifically, the hardness of the primary sheet can be lowered by reducing the ratio of the amount of the curing agent blended to the amount of the base resin.

The content of the silicone resin is such that the volume content (volume-based content) is 32% by volume or less based on the total amount of the thermally conductive sheet. When the volume content of the silicone resin exceeds 32% by volume, the volume content of the thermally conductive filler decreases, and the thermal conductivity of the thermally conductive sheet decreases. From the viewpoint of further improving the thermal conductivity of the thermally conductive sheet, the volume content of the silicone resin is preferably 31% by volume or less. When the volume content of the silicone resin is lowered as described above, a compound of the silicone resin and the thermally conductive filler cannot be appropriately obtained, which makes it difficult to produce a thermally conductive sheet, but in the present invention, the volume content of the silicone resin can be lowered by adopting a specific production method described later.

In addition, the volume content of the silicone resin is preferably 18% by volume or more from the viewpoint of enabling the production of a thermally conductive sheet.

On the other hand, the content of the thermally conductive filler in terms of volume content is preferably 68% by volume or more and more preferably 69% by volume or more based on the total amount of the thermally conductive sheet from the viewpoint of improving the thermal conductivity. The content of the thermally conductive filler is the total amount of the anisotropic filler and the non-anisotropic filler.

In the present invention, the unit layers 13 and 13 that are adjacent are adhered to each other, and each unit layer 13 is preferably firmly adhered directly to a unit layer 13 that is adjacent thereto. That is, the unit layers 13 and 13 that are adjacent are preferably adhered directly without a material other than the unit layers such as an adhesive interposed therebetween. With such a configuration, the silicone resin 11 is used as the matrix component in each unit layer 13 as described above, and thus the silicone resins 11 are adhered to each other.

It is generally difficult to adhere the silicone resins 11 to each other using a high adhesive force, but in the present embodiment, the thermally conductive sheet is produced by a specific production method as will be described later, and thus the unit layers 13 that are adjacent are adhered to each other. Therefore, peeling does not occur at the interface between the unit layers 13. In addition, the unit layers 13 and 13 are adhered to each other without another member interposed therebetween, and thus the thermally conductive sheet 10 has high softness.

(Anisotropic Filler)

The anisotropic filler 14 is a filler that has anisotropy in shape and can be oriented. The anisotropic filler 14 is preferably at least one selected from the group consisting of a fibrous material and a flaky material. The anisotropic filler 14 generally has a high aspect ratio, has an aspect ratio of more than 2, and has an aspect ratio of more preferably 5 or more. By setting the aspect ratio to larger than 2, the anisotropic filler 14 can be easily oriented in the thickness direction z, and the thermally conductive property of the thermally conductive sheet 10 can be easily enhanced.

In addition, the upper limit of the aspect ratio is not particularly limited, and is practically 100.

The aspect ratio is the ratio of the length in the major axis direction to the length in the minor axis direction of the anisotropic filler 14, and in the fibrous material, the aspect ratio means fiber length/fiber diameter, and in the flaky material, the aspect ratio means the length in the major axis direction/the thickness of the flaky material.

The content of the anisotropic filler 14 in the thermally conductive sheet is preferably 10 to 500 parts by mass and more preferably 50 to 350 parts by mass per 100 parts by mass of the silicone resin. In addition, the content, expressed as volume content, of the anisotropic filler 14 is preferably 2 to 50% by volume and more preferably 10 to 40% by volume based on the total amount of the thermally conductive sheet.

By setting the content of the anisotropic filler 14 to 10 parts by mass or more, the thermally conductive property can be easily enhanced, and by setting the content to 500 parts by mass or less, the viscosity of the liquid composition described later easily becomes appropriate, and the orientation of the anisotropic filler 14 becomes good.

When the anisotropic filler 14 is a fibrous material, the average fiber length thereof is preferably 10 to 500 μm and more preferably 20 to 350 μm. By setting the average fiber length to 10 μm or more, the anisotropic fillers appropriately contact each other in each thermally conductive sheet 10 to secure a heat transfer path and improve the thermally conductive property of the thermally conductive sheet 10.

On the other hand, by setting the average fiber length to 500 μm or less, the bulk of the anisotropic filler becomes low, and the silicone resin can be highly filled therewith. In addition, even if an anisotropic filler 14 having electric conductivity is used, the electric conductivity of the thermally conductive sheet 10 is prevented from becoming higher than necessary.

The average fiber length can be calculated by observing the anisotropic filler using a microscope. More specifically, for example, the fiber lengths of 50 arbitrary anisotropic fillers, wherein the arbitrary anisotropic fillers are each the anisotropic filler 14 separated by dissolving the matrix component of the thermally conductive sheet 10, are measured using an electron microscope or an optical microscope, and the average value (arithmetic average value) thereof can be used as the average fiber length. At this time, application of a large shear is avoided so as not to pulverize the fiber. In addition, if it is difficult to separate the anisotropic filler 14 from the thermally conductive sheet 10, the fiber lengths of the anisotropic fillers 40 may be measured using an X-ray CT apparatus to calculate the average fiber length thereof.

In addition, the diameter of the anisotropic filler 14 can also be measured in the same manner using an electron microscope, an optical microscope, or an X-ray CT apparatus.

In the present invention, an arbitrary one refers to a randomly selected one.

When the anisotropic filler 14 is a flaky material, the average particle size thereof is preferably 10 to 400 μm and more preferably 15 to 300 μm. In addition, the average particle size is particularly preferably 20 to 200 μm. By setting the average particle size to 10 μm or more, the anisotropic fillers 14 easily contact each other in the thermally conductive sheet 10 to secure a heat transfer path and improve the thermally conductive property of the thermally conductive sheet 10. On the other hand, by setting the average particle size to 400 μm or less, the bulk of the anisotropic filler 14 decreases, and the silicone resin 11 can be highly filled with the anisotropic filler 14.

The average particle size of the flaky material can be calculated by observing the anisotropic filler using a microscope and using the major axis as the diameter. More specifically, in the same manner as for the average fiber length, the major axes of 50 arbitrary anisotropic fillers are measured using an electron microscope, an optical microscope, or an X-ray CT apparatus, and the average value (arithmetic average value) thereof can be used as the average particle size.

In addition, the thickness of the anisotropic filler 14 can also be measured in the same manner using an electron microscope, an optical microscope, or an X-ray CT apparatus.

As the anisotropic filler 14, a known material having a thermally conductive property may be used. In addition, the anisotropic filler 14 may have electric conductivity or an electrically insulating property. When the anisotropic filler 14 has an electrically insulating property, the electrically insulating property of the thermally conductive sheet 10 in the thickness direction z can be enhanced, and thus the thermally conductive sheet 10 can be suitably used in an electric device. In the present invention, having electric conductivity refers to, for example, a case where the volume resistivity is $1 \times 10^9$ Ω·cm or less. In addition, having an electrically insulating property refers to, for example, a case where the volume resistivity exceeds $1 \times 10^9$ Ω·cm.

Specific examples of the anisotropic filler 14 include a carbon-based material typified by a carbon fiber or a flaky carbon powder, a metal material typified by a metal fiber, a metal oxide, boron nitride and a metal nitride, a metal carbide, a metal hydroxide, and a polyparaphenylene benzoxazole fiber and the like. Among these, a carbon-based material is preferable because it has a small specific gravity and good dispersing ability in the silicone resin 11, and among such carbon-based materials, a graphitized carbon material having a high thermal conductivity is more preferable. In addition, boron nitride and a polyparaphenylene benzoxazole fiber are preferable from the viewpoint of having an electrically insulating property, and among these, boron nitride is more preferable. Boron nitride is not particularly limited, and is preferably used as a flaky material. The flaky boron nitride may or may not be aggregated, and preferably includes unaggregated boron nitride in at least a part thereof.

The anisotropic filler 14 is not particularly limited, and the thermal conductivity along the anisotropic direction (that is, the major axis direction) is generally 30 W/m·K or more and preferably 100 W/m·K or more. The upper limit of the thermal conductivity of the anisotropic filler 14 is not particularly limited, and is, for example, 2000 W/m·K or less. The method for measuring the thermal conductivity is a laser flash method.

One anisotropic filler 14 may be used alone or two or more may be used in combination. For example, as the anisotropic filler 14, at least two anisotropic fillers 14 having average particle sizes or average fiber lengths that are different from each other may be used. It is considered that when anisotropic fillers having different sizes are used, by allowing the relatively small anisotropic filler to go in between the relatively large anisotropic fillers, the silicone resin can be filled with the anisotropic fillers at a high density and the thermal conduction efficiency can be enhanced.

The carbon fiber used as the anisotropic filler 14 is preferably a graphitized carbon fiber. In addition, as the flaky carbon powder, a flaky graphite powder is preferable. Among these, a graphitized carbon fiber is more preferable as the anisotropic filler 14.

The graphitized carbon fiber has crystal planes of graphite connected in a fiber axis direction and has a high thermal conductivity in the fiber axis direction. Because of this, by aligning the fiber axis directions in a predetermined direction, the thermal conductivity in a specific direction can be enhanced. In addition, the flaky graphite powder has crystal planes of graphite connected in an in-plane direction of a flaky plane and has a high thermal conductivity in the in-plane direction. Because of this, by aligning the flaky planes in a predetermined direction, the thermal conductivity in a specific direction can be enhanced. The graphitized carbon fiber and the flaky graphite powder preferably have a high degree of graphitization.

As the graphitized carbon material such as the graphitized carbon fiber described above, the following raw materials can be graphitized and used. Examples thereof include a condensed polycyclic hydrocarbon compound such as naphthalene, and a condensed heterocyclic compound such as PAN (polyacrylonitrile) or a pitch, and in particular, a graphitized mesophase pitch having a high degree of graphitization, polyimide, or polybenzazole is preferably used. For example, by using a mesophase pitch, in a spinning step described later, the pitch is oriented in a fiber axis direction because of its anisotropy, and a graphitized carbon fiber having an excellent thermally conductive property in the fiber axis direction can be obtained.

The mode of use of the mesophase pitch in the graphitized carbon fiber is not particularly limited as long as it can be spun, and the mesophase pitch may be used alone or in combination with another raw material. However, the use of the mesophase pitch alone, that is, a graphitized carbon fiber having a mesophase pitch content of 100% is most preferable from the viewpoint of thermal conduction enhancement, spinnability, and quality stability.

As the graphitized carbon fiber, one obtained by sequentially carrying out each treatment of spinning, infusibilization, and carbonization, and pulverization or cutting to a predetermined particle size followed by graphitization, or one obtained by carbonization and then pulverization or cutting followed by graphitization can be used. When carrying out pulverization or cutting before graphitization, the condensation polymerization reaction and cyclization reaction easily proceed during the graphitization treatment on the surface newly exposed by the pulverization, and thus it is possible to obtain a graphitized carbon fiber in which the degree of graphitization is increased and the thermally conductive property is further improved. On the other hand, when a spun carbon fiber is graphitized and then pulverized, the carbon fiber after graphitization is rigid and thus easily pulverized, and a carbon fiber powder having a relatively narrow fiber length distribution can be obtained by pulverization for a short time.

The average fiber length of the graphitized carbon fiber is preferably 50 to 500 μm and more preferably 70 to 350 μm. In addition, the aspect ratio of the graphitized carbon fiber exceeds 2 as described above, and is preferably 5 or more. The thermal conductivity of the graphitized carbon fiber is not particularly limited, and the thermal conductivity in the fiber axis direction is preferably 400 W/m·K or more and more preferably 800 W/m·K or more.

The anisotropic filler 14 is oriented in the thickness direction z of the thermally conductive sheet in each unit layer. The orientation of the anisotropic filler 14 in the thickness direction z will be described more specifically; when the anisotropic filler 14 is a fibrous filler, the orientation thereof means that the proportion of the number of anisotropic fillers having an angle formed by the major axis of the fibrous filler with respect to the thickness direction z of the thermally conductive sheet 10 of less than 30° is in a state of exceeding 50% based on the total amount of the anisotropic fillers; and the proportion preferably exceeds 80%.

In addition, when the anisotropic filler 14 is a flaky filler, the orientation thereof means that the proportion of the number of anisotropic fillers having an angle formed by the flaky plane of the flaky filler with respect to the thickness direction z of the thermally conductive sheet 10 of less than 30° is in a state of exceeding 50% based on the total amount of the anisotropic fillers; and the proportion can preferably exceed 80%. In other words, the orientation thereof means that the proportion of the number of anisotropic fillers having an angle formed by the normal direction of the flaky plane with respect to the sheet plane (x-y plane) of the thermally conductive sheet of less than 30° is in a state of exceeding 50% based on the total amount of the anisotropic fillers; and the proportion preferably exceeds 80%.

The orientation direction of the anisotropic filler 14 is preferably such that the angle formed by the major axis or the angle formed by the flaky plane with respect to the thickness direction z is 0° or more and less than 5° from the viewpoint of increasing the thermal conductivity. On the other hand, it is also possible to cause inclination in the range of 5° or more and less than 30° in that the load when the thermally conductive sheet 10 is compressed can be reduced. These angles are average values of the orientation angles of a certain number of anisotropic fillers 14 (for example, 50 arbitrary anisotropic fillers 14).

Further, when the anisotropic filler 14 is not fibrous or flaky, the orientation thereof means that the proportion of the number of anisotropic fillers having an angle formed by the major axis of the anisotropic filler 14 with respect to the thickness direction z of the thermally conductive sheet 10 of less than 30° is in a state of exceeding 50% based on the total amount of the anisotropic fillers; and the proportion shall preferably exceed 80%.

In addition, when the anisotropic filler 14 is a flaky material, further, the normal direction of the flaky plane of the anisotropic filler 14 preferably faces in a predetermined direction, and specifically, preferably faces in the lamination direction x of a plurality of unit layers 13. By the normal direction facing in the lamination direction x as described above, the thermally conductive property in the thickness direction z of the thermally conductive sheet 10 is improved. In addition, the thermally conductive property in a direction along the plane direction of the thermally conductive sheet 10 and orthogonal to the lamination direction x is also improved.

The statement that the normal direction of the flaky plane faces in the lamination direction x means that the proportion of the number of carbon fiber powders having an angle formed by the normal direction with respect to the lamination direction x of less than 30° is in a state of exceeding 50%; and the proportion preferably exceeds 80%.

When the anisotropic filler 14 is a flaky material, the normal direction of the flaky plane faces in the lamination direction x by forming the anisotropic filler 14 into a sheet shape while applying a shear force, as described in the production method described later.

<Non-Anisotropic Filler>

The non-anisotropic filler 15 is a thermally conductive filler contained in the thermally conductive sheet 10 separately from the anisotropic filler 14, and is a material that imparts a thermally conductive property to the thermally conductive sheet 10 together with the anisotropic filler 14. In the present embodiment, because the non-anisotropic filler 15 is contained, a filler is interposed in a gap between the oriented anisotropic fillers 14 to obtain a thermally conductive sheet 10 having a high thermal conductivity.

The non-anisotropic filler 15 is a filler that has substantially no anisotropy in shape, and that, even in an environment in which the anisotropic filler 14 is oriented in a predetermined direction, such as under a shear force action described later, is not oriented in the predetermined direction.

The non-anisotropic filler 15 has an aspect ratio of 2 or less and more preferably 1.5 or less. In the present embodiment, because the non-anisotropic filler 15 having such a low aspect ratio is contained, a filler having a thermally conductive property is appropriately interposed in a gap between the anisotropic fillers 14 to obtain a thermally conductive sheet 10 having a high thermal conductivity. In addition, by setting the aspect ratio to 2 or less, it is possible to prevent the viscosity of the liquid composition described later from increasing to achieve high filling.

The non-anisotropic filler 15 may have electric conductivity, and preferably has an electrically insulating property, and in the thermally conductive sheet 10, both of the anisotropic filler 14 and the non-anisotropic filler 15 preferably have an electrically insulating property. As described above, when both of the anisotropic filler 14 and the non-anisotropic filler 15 are electrically insulating, it becomes easier to further enhance the electrically insulating property of the thermally conductive sheet 10 in the thickness direction z.

Specific examples of the non-anisotropic filler 15 include a metal, a metal oxide, a metal nitride, a metal hydroxide, a carbon material, and a non-metal oxide, nitride, and carbide. In addition, examples of the shape of the non-anisotropic filler 14 include a spherical or irregular powder.

In the non-anisotropic filler 15, examples of the metal include aluminum, copper, and nickel, examples of the metal oxide include aluminum oxide, magnesium oxide, and zinc oxide, and examples of the metal nitride include aluminum nitride. Examples of the metal hydroxide include aluminum hydroxide. Further, examples of the carbon material include spheroidal graphite. Examples of the non-metal oxide, nitride, and carbide include quartz, boron nitride, and silicon carbide.

Among these, aluminum oxide and aluminum are preferable in that they have a high thermal conductivity and spherical ones are easily available, and aluminum hydroxide is preferable in that it is easily available and can enhance the flame retardancy of the thermally conductive sheet.

Among the above, examples of the non-anisotropic filler 15 having an electrically insulating property include a metal oxide, a metal nitride, a metal hydroxide, and a metal carbide, and aluminum oxide and aluminum hydroxide are particularly preferable.

As the non-anisotropic filler 15, one of those described above may be used alone or two or more may be used in combination.

The average particle size of the non-anisotropic filler 15 is preferably 0.1 to 50 μm and more preferably 0.3 to 35 μm. By setting the average particle size to 50 μm or less, a problem such as disturbing the orientation of the anisotropic filler 14 is less likely to occur. In addition, by setting the average particle size to 0.1 μm or more, the specific surface area of the non-anisotropic filler 15 does not become larger than necessary, and the viscosity of the liquid composition is less likely to increase even if the non-anisotropic filler 15 is blended in a large amount, to facilitate high filling with the non-anisotropic filler 15.

In addition, from the viewpoint of increasing the amount of the non-anisotropic filler used for filling, it is preferable to use two or more fillers having different particle sizes in combination, and for example, it is preferable to use a non-anisotropic filler having a small particle size that is an average particle size of 0.1 μm or more and 2 μm or less and a non-anisotropic filler having a large particle size that is an average particle size of more than 2 μm and 50 μm or less in combination. When two non-anisotropic fillers having different average particle sizes are used in combination as described above, the amount of the non-anisotropic filler having a small particle size relative to that of the non-anisotropic filler having a large particle size (the amount of the non-anisotropic filler having a small particle size/the amount of the non-anisotropic filler having a large particle size) is preferably 0.05 to 5, preferably 0.2 to 1.0.

When a certain amount of a non-anisotropic filler having a small particle size is used as described above, it becomes generally difficult to form a primary sheet for creating a thermally conductive sheet, but according to the method for producing the thermally conductive sheet of the present invention described later, even when a certain amount of a non-anisotropic filler having a small particle size is used as described above, the thermally conductive sheet can be appropriately produced.

The average particle size of the non-anisotropic filler 15 can be measured by observation using an electron microscope or the like. More specifically, in the same manner as in the measurement with the anisotropic filler described above, the particle sizes of 50 arbitrary non-anisotropic fillers are measured using an electron microscope, an optical microscope, or an X-ray CT apparatus, and the average value (arithmetic average value) thereof can be used as the average particle size.

The content of the non-isotropic filler 15 in the thermally conductive sheet 10 is preferably in the range of 50 to 1500 parts by mass and more preferably in the range of 200 to 800 parts by mass per 100 parts by mass of the silicone resin. When the content is 50 parts by mass or more, the amount of the non-anisotropic filler 15 interposed in a gap between the anisotropic fillers 14 becomes a certain amount or more to improve the thermally conductive property. On the other hand, when the content is 1500 parts by mass or less, the effect of enhancing the thermally conductive property according to the content can be obtained, and additionally, the non-anisotropic filler 15 does not inhibit the thermal conduction by the anisotropic filler 14. In addition, when the content is in the range of 200 to 800 parts by mass, the thermally conductive property of the thermally conductive sheet 10 is excellent, and the viscosity of the liquid composition is also suitable.

The content, expressed in % by volume, of the non-anisotropic filler 15 is preferably 20 to 75% by volume and more preferably 30 to 60% by volume based on the total amount of the thermally conductive sheet.

In addition, the content of the non-anisotropic filler having a small particle size that is an average particle size of 0.1 μm or more and 2 μm or less used as the non-anisotropic filler 15 is preferably 180 to 500 parts by mass and particularly preferably 200 to 420 parts by mass per 100 parts by mass of the silicone resin. This is because with this range, the puncture load of the liquid composition can be reduced.

In the present embodiment, each unit layer 13 has substantially the same composition. Therefore, the content of each of the anisotropic filler, the non-anisotropic filler, and the silicone resin in each unit layer is the same as the content in the thermally conductive sheet, and the content of each of the anisotropic filler, the non-isotropic filler, and the silicone resin in each unit layer are also as described above.

(Additive Components)

In the thermally conductive sheet 10, various additives may be further blended into the silicone resin 11 as long as the function as the thermally conductive sheet 10 is not impaired. Examples of the additive include at least one or more selected from the group consisting of a dispersant, a coupling agent, a pressure-sensitive adhesive, a fire retardant, an antioxidant, a colorant, an antisettling agent, and the like. In addition, when the curable silicone composition is cured as described above, a curing catalyst or the like that accelerates the curing may be blended as an additive. Examples of the curing catalyst include a platinum-based catalyst. In addition, into the silicone resin 11, a resin component other than the silicone resin may be mixed as an additive component as long as the effect of the present invention is not impaired.

(Thermally Conductive Sheet)

The thermal conductivity of the thermally conductive sheet 10 in the thickness direction z is, for example, 4.5 W/(m·K) or more, preferably 8.0 W/(m·K) or more, and more preferably 12.0 W/(m·K) or more. By setting the thermal conductivity to these lower limits or more, the thermally conductive property of the thermally conductive sheet 10 in the thickness direction z can be made excellent. There is no particular upper limit, and the thermal conductivity of the thermally conductive sheet 10 in the thickness direction z is, for example, 50 W/(m·K) or less. The thermal conductivity shall be measured by the method according to ASTM D5470-06.

The type OO hardness of the thermally conductive sheet 10 is, for example, 62 or less. When the thermally conductive sheet 10 has a type OO hardness of 62 or less, the softness is ensured, the conformability to, for example, a heating element and a heat-dissipating element becomes good, and the heat-dissipating property easily becomes good. In addition, from the viewpoint of improving the softness to make the conformability and the like excellent, the type OO hardness of the thermally conductive sheet 10 is preferably 50 or less and more preferably 45 or less.

In addition, the type OO hardness of the thermally conductive sheet 10 is not particularly limited, and is, for example, 15 or more, preferably 18 or more, and more preferably 25 or more.

In the present embodiment, the anisotropic filler 14 is exposed on both sides 10A and 10B of the thermally conductive sheet 10. In addition, the exposed anisotropic filler 14 may protrude from each of both the sides 10A and 10B. In the thermally conductive sheet 10, because the anisotropic filler 14 is exposed on both the sides 10A and 10B, both the sides 10A and 10B become non-pressure-sensitive adhesive surfaces. In the thermally conductive sheet 10, both the sides 10A and 10B become cut surfaces by cutting using a blade described later, and thus the anisotropic filler 14 is exposed on both the sides 10A and 10B.

However, either one or both of both the sides 10A and 10B may become a pressure-sensitive adhesive surface(s) without exposure of the anisotropic filler 14.

The thickness of the thermally conductive sheet 10 is suitably changed according to the shape and application of the electronic device on which the thermally conductive sheet 10 is mounted. The thickness of the thermally conductive sheet 10 is not particularly limited, and may be used, for example, in the range of 0.1 to 50 mm.

In addition, the thickness of each unit layer 13 is not particularly limited, and is preferably 0.1 to 10 mm and more preferably 0.3 to 5.0 mm. The thickness of the unit layer 13 is the length of the unit layer 13 along the lamination direction x of the unit layer 13.

The thermally conductive sheet 10 is used inside an electronic device or the like. Specifically, the thermally conductive sheet 10 is interposed between a heating element and a heat-dissipating element, conducts heat generated by the heating element, and transfers the heat to the heat-dissipating element to dissipate the heat from the heat-dissipating element. Here, examples of the heating element include various electronic parts such as a CPU, a power amplifier, and a power supply used inside an electronic device. In addition, examples of the heat-dissipating element include a heat sink, a heat pipe, and a metal housing of an electronic device. The thermally conductive sheet 10 is used by causing both the sides 10A and 10B respectively to be in close contact with the heating element and the heat-dissipating element, respectively, and being compressed.

<Method for Producing Thermally Conductive Sheet>
(First Production Method)

The method for producing the thermally conductive sheet of the present invention is not particularly limited, and a first production method including each step of the following step (1), step (2), step (4), and step (5) is preferable.

That is, the first production method of the thermally conductive sheet of the present invention is a method for producing a thermally conductive sheet, including:
- a step (1) of forming a liquid composition including a curable silicone composition, a thermally conductive filler, and a volatile compound into a sheet shape to obtain a sheet-shaped formed product;
- a step (2) of curing the curable silicone composition while volatilizing a part of the volatile compound included in the sheet-shaped formed product in a state in which the sheet-shaped formed product is disposed between two films at least one of which is a gas-permeable film, to obtain a primary sheet;
- a step (4) of providing a plurality of the primary sheets and laminating the plurality of the primary sheets to adhere the plurality of the primary sheets to form a laminated block; and
- a step (5) of cutting the laminated block into a sheet shape along a lamination direction to obtain a thermally conductive sheet.

<Step (1)>

The step (1) is a step of forming a liquid composition including a curable silicone composition, a thermally conductive filler, and a volatile compound into a sheet shape to obtain a sheet-shaped formed product. Here, the curable silicone composition is a raw material of the silicone resin as described above.

The liquid composition contains a volatile compound in addition to a curable silicone composition and a thermally conductive filler. By using the liquid composition containing a volatile compound, a liquid composition having a higher content of the thermally conductive filler than conventionally can be produced, and further, by going through a specific step described later, a thermally conductive sheet having a high content of the thermally conductive filler (that is, a low content of the silicone resin) can be obtained.

As used herein, the volatile compound means a compound having at least either one of the following properties: the temperature $T1$ at which the weight loss when the temperature is raised under a condition of 2° C./min in thermogravimetric analysis is 90% is in the range of 70 to 300° C., and the boiling point (1 atm) is in the range of 60 to 200° C. Here, the temperature $T1$ at which the weight loss is 90% means the temperature at which when the weight of a sample before thermogravimetric analysis is 100%, the weight is reduced by 90% (that is, the temperature at which the weight is 10% of the weight before measurement).

Examples of the volatile compound include a volatile silane compound and a volatile solvent, and among these, a volatile silane compound is preferable.

Examples of the volatile silane compound include an alkoxysilane compound. The alkoxysilane compound is a compound having a structure in which 1 to 3 of the four bonds of the silicon atom (Si) are bonded to alkoxy groups and the remaining bond(s) is(are) bonded to an organic substituent. Examples of the alkoxy group of the alkoxysilane compound include a methoxy group, an ethoxy group, a propoxy group, a butoxy group, a pentoxy group, and a hexatoxy group. The alkoxysilane compound may be contained as a dimer.

Among the alkoxysilane compounds, an alkoxysilane compound having a methoxy group or an ethoxy group is preferable from the viewpoint of easy availability. The number of alkoxy groups of the alkoxysilane compound is preferably 3 from the viewpoint of enhancing the affinity for the thermally conductive filler as an inorganic substance. The alkoxysilane compound is more preferably at least one selected from the group consisting of a trimethoxysilane compound and a triethoxysilane compound.

Examples of a functional group included in the organic substituent of the alkoxysilane compound include an acryloyl group, an alkyl group, a carboxyl group, a vinyl group, a methacryloyl group, an aromatic group, an amino group, an isocyanate group, an isocyanurate group, an epoxy group, a hydroxyl group, and a mercapto group. Here, when an addition-reaction type organopolysiloxane including a platinum catalyst is used as a precursor of the above matrix, it is preferable to select and use an alkoxysilane compound that is unlikely to affect the curing reaction of the organopolysiloxane forming the matrix. Specifically, when an addition-reaction type organopolysiloxane including a platinum catalyst is used, the organic substituent of the alkoxysilane compound preferably does not include an amino group, an isocyanate group, an isocyanurate group, a hydroxyl group, or a mercapto group.

The alkoxysilane compound facilitates high filling with the thermally conductive filler by enhancing the dispersing ability of the thermally conductive filler, and thus it is preferable to include an alkylalkoxysilane compound having an alkyl group bonded to a silicon atom, that is, an alkoxysilane compound having an alkyl group as an organic substituent. The number of carbon atoms of the alkyl group bonded to the silicon atom is preferably 4 or more. In addition, the number of carbon atoms of the alkyl group bonded to the silicon atom is preferably 16 or less from the viewpoint of causing the viscosity of the alkoxysilane compound itself to be relatively low and suppressing the viscosity of the thermally conductive composition to a low level.

As the alkoxysilane compound, one or two or more can be used. Specific examples of the alkoxysilane compound include an alkyl group-containing alkoxysilane compound, a vinyl group-containing alkoxysilane compound, an acryloyl group-containing alkoxysilane compound, a methacryloyl group-containing alkoxysilane compound, an aromatic group-containing alkoxysilane compound, an amino group-containing alkoxysilane compound, an isocyanate group-containing alkoxysilane compound, an isocyanurate group-containing alkoxysilane compound, an epoxy group-containing alkoxysilane compound, and a mercapto group-containing alkoxysilane compound.

Examples of the alkyl group-containing alkoxysilane compound include methyltrimethoxysilane, dimethyldimethoxysilane, trimethylmethoxysilane, methyltriethoxysilane, dimethyldiethoxysilane, ethyltrimethoxysilane, n-propyltrimethoxysilane, n-propyltriethoxysilane, isobutyltrimethoxysilane, isobutyltriethoxysilane, n-hexyltrimethoxysilane, n-hexyltriethoxysilane, cyclohexylmethyldimethoxysilane, n-octyltriethoxysilane, and n-decyltrimethoxysilane. Among the alkyl group-containing alkoxysilane compounds, at least one selected from the group consisting of isobutyltrimethoxysilane, isobutyltriethoxysilane, n-hexyltrimethoxysilane, n-hexyltriethoxysilane, cyclohexylmethyldimethoxysilane, n-octyltriethoxysilane, and n-decyltrimethoxysilane is preferable, at least one selected from the group consisting of n-octyltriethoxysilane and n-decyltrimethoxysilane is more preferable, and n-decyltrimethoxysilane is particularly preferable.

Examples of the vinyl group-containing alkoxysilane compound include vinyltrimethoxysilane and vinyltriethoxysilane. Examples of the acryloyl group-containing alkoxysilane compound include 3-acryloxypropyltrimethoxysilane. Examples of the methacryloyl group-containing alkoxysilane compound include 3-methacryloxypropylmethyldimethoxysilane, 3-methacryloxypropyltrimethoxysilane, and 3-methacryloxypropyltriethoxysilane. Examples of the aromatic group-containing alkoxysilane compound include phenyltrimethoxysilane and phenyltriethoxysilane. Examples of the amino group-containing alkoxysilane compound include N-2-(aminoethyl)-3-aminopropylmethyldimethoxysilane, N-2-(aminoethyl)-3-aminopropyltrimethoxysilane, 3-aminopropyltrimethoxysilane, 3-aminopropyltriethoxysilane, and N-phenyl-3-aminopropyltrimethoxysilane. Examples of the isocyanate group-containing alkoxysilane compound include 3-isocyanatopropyltriethoxysilane. Examples of the isocyanurate group-containing alkoxysilane compound include tris-(trimethoxysilylpropyl)isocyanurate. Examples of the epoxy group-containing alkoxysilane compound include 2-(3,4-epoxycyclohexyl)ethyltrimethoxysilane, 3-glycidoxypropylmethyldimethoxysilane, 3-glycidoxypropyltrimethoxysilane, and 3-glycidoxypropyltriethoxysilane. Examples of the mercapto group-containing alkoxysilane compound include 3-mercaptopropyltrimethoxysilane.

The above specific examples of the alkoxysilane compounds are merely examples, and the alkoxysilane compounds are not limited thereto.

As the volatile solvent, a solvent having a boiling point (1 atm) of 60 to 200° C., preferably a boiling point of 100 to 130° C., can be used. In addition, the volatile solvent preferably has a higher boiling point than the curing temperature of the organopolysiloxane by 10° C. or more, and more preferably a higher boiling point by 20° C. or more.

As the type of volatile solvent, a solvent satisfying the above requirements can be suitably selected, and it is preferable to use an aromatic compound such as toluene.

The content of the volatile compound in the liquid composition is preferably 5 to 100 parts by mass and more preferably 15 to 70 parts by mass per 100 parts by mass of the curable silicone composition, which is a raw material of the silicone resin.

The content of each of the curable silicone composition and the thermally conductive filler in the liquid composition may be adjusted such that the content of each of the silicone resin and the thermally conductive filler in the thermally conductive sheet formed from the liquid composition is in the above range.

Specifically, when the total amount of all components excluding the volatile compound in the liquid composition is 100% by volume, the curable silicone composition is preferably 32% by volume or less and more preferably 31% by volume or less. In addition, when the total amount of all components excluding the volatile compound in the liquid composition is 100% by volume, the thermally conductive filler is preferably 68% by volume or more and more preferably 69% by volume or more.

The liquid composition is prepared by mixing a curable silicone composition, a thermally conductive filler (that is, an anisotropic filler 14, a non-anisotropic filler 15), and a volatile compound. The liquid composition is usually a slurry. An additive component may optionally be further mixed suitably into the liquid composition. Here, for mixing each component constituting the liquid composition, for example, a known kneader, kneading roll, mixer, or vibration stirrer may be used.

In the step (1), the liquid composition prepared as described above is formed into a sheet shape to be a sheet-shaped formed product.

The viscosity of the liquid composition can be determined according to the sheet forming means and the desired sheet thickness. When the liquid composition is formed into a sheet shape by applying the same to a base material, the viscosity of the liquid composition is preferably 50 to 10000 Pa·s. By setting the viscosity to 50 Pa·s or more, the anisotropic filler can be easily oriented in the plane direction of the primary sheet by applying a shear force. In addition, by setting the viscosity to 10000 Pa·s or less, the applicability becomes good.

The viscosity is the viscosity measured at a rotation speed of 1 rpm using a rotational viscometer (Brookfield viscometer DV-E, spindle SC4-14), and the measurement temperature is the temperature at the time of applying the liquid composition.

The puncture load of the liquid composition is preferably 0.1 to 120 gf, more preferably 5.0 to 60 gf, and further preferably 10 to 40 gf. When the puncture load is in the above range, the liquid composition can be appropriately applied onto the base material and can be formed into a sheet shape. The puncture load of the liquid composition can be measured by the method described in Examples.

The curable silicone composition is usually a liquid, and the above viscosity may be set by suitably adjusting the molecular weight and the like of each component (alkenyl group-containing organopolysiloxane, organohydrogenpolysiloxane, and the like) constituting the curable silicone composition.

Next, the liquid composition is formed into a sheet shape while applying a shear force, to form a sheet-shaped formed product, and thereby the anisotropic filler 14 is oriented in a direction parallel to the sheet plane (that is, the plane direction). Here, the liquid composition may be applied onto a base material film, for example, using a coating applicator such as a bar coater or a doctor blade, or by extrusion, discharge from a nozzle, or the like, and such a method can give a shear force along the application direction of the liquid composition. The anisotropic filler 14 in the liquid composition undergoes this shear force and is oriented in the application direction. The base material film may be a gas-permeable film described later.

In addition, as another method for obtaining a sheet-shaped formed product, for example, a method involving sandwiching the liquid composition sandwiched between, for example, two films and stretching the same using a stretching roll can also be applied.

<Step (2)>

The step (2) is a step of curing the curable silicone composition while volatilizing a part of the volatile compound included in the sheet-shaped formed product obtained in the above step (1) in a state in which the sheet-shaped formed product is disposed between two films at least one of which is a gas-permeable film, to obtain a primary sheet.

In the step (2), the sheet-shaped formed product is disposed between two films. Specifically, two films are provided in such a way as to be in contact with both sides of the sheet-shaped formed product. At least one of the two films is a gas-permeable film.

By using the gas-permeable film, when the curable silicone composition included in the sheet-shaped formed product is cured, the volatile compound can be appropriately volatilized, and the generation of an air bubble or the like can be suppressed in the primary sheet formed from the sheet-shaped formed product. In addition, the surface of the primary sheet also has little unevenness, which makes it easier to form a laminated block in the step (4).

Here, the gas permeability means the property of a liquid being unable to permeate but a gas being able to permeate, and the oxygen permeability of the gas-permeable film is preferably, for example, $1 \times 10^{-16}$ mol·m/(m$^2$·s·Pa) or more. In addition, the moisture permeability of the gas-permeable film is further preferably $1 \times 10^{-15}$ mol·m/(m$^2$s·Pa) or more. Here, the moisture permeability is a value measured according to the gas permeability test method of JIS K7126-2: 2006.

Examples of the gas-permeable film include a film made porous by a mixture of a polymer and a filler, a mixture of polymers, or the like, and any film having gas permeability may be used even if the film is not made porous.

The polymer constituting the gas-permeable film is not particularly limited, and examples thereof include low-density polyethylene, linear low-density polyethylene, poly 4 methylpentene-1, ethyl cellulose, and a fluorine-based resin such as polytetrafluoroethylene or a fluorine-modified resin. Among these, a non-porous gas-permeable film formed from poly 4 methylpentene-1 and a porous gas-permeable film formed from a fluorine-based resin are preferable. By using a gas-permeable film formed from poly 4 methylpentene-1 or a fluorine-based resin, the volatile compound can be appropriately volatilized when the curable silicone composition is cured, and further, excellent releasability is provided when the gas-permeable film is peeled off from the primary sheet. In addition, it is particularly preferable to use a non-porous gas-permeable film formed from poly 4 methylpentene-1. If a non-porous gas-permeable film formed from poly 4 methylpentene-1 is used, a liquid resin does not penetrate into a pore when the liquid composition is applied, and thus the releasability is particularly excellent, and further, unevenness due to a pore is not formed because of the absence of a pore on the film surface, and thus a primary sheet having little unevenness and a good surface condition can be obtained.

In the two films used in the step (2), at least one thereof may be a gas-permeable film, and the both may be gas-permeable films. In addition, of the two films, one may be a gas-permeable film and the other may be a film having no gas permeability such as a polyester-based film or a polyolefin-based film.

In the step (2), the method for disposing the sheet-shaped formed product obtained in the step (1) between the two films is not particularly limited. For example, in the step (1), when the liquid composition is applied onto a base material film to produce a sheet-shaped formed product, the base material film is used as one of the two films and the other film may be disposed in such a way as to be in contact with the sheet-shaped formed product. In addition, when the sheet-shaped formed product is obtained alone in the step (1), two films may be provided to dispose the sheet-shaped formed product between the two films.

In the step (2), the curable silicone composition is cured while volatilizing a part of the volatile compound included in the sheet-shaped formed product in a state in which the sheet-shaped formed product is disposed between the two films, to obtain a primary sheet. Here, the curable silicone composition is cured by heating, and a part of the volatile compound can be volatilized by the heating.

The primary sheet produced without volatilizing the volatile compound is too soft to be restorable, and when the primary sheets are laminated in the step (4), the primary sheets are crushed and it becomes difficult to produce a thermally conductive sheet.

On the other hand, the primary sheets produced by completely volatilizing the volatile compound have poor adhesiveness between the primary sheets when the primary sheets are laminated in the step (4), and as a result, it becomes difficult to produce a thermally conductive sheet.

In the step (2), the amount of the volatile compound volatilized is preferably 10 to 80% by mass, preferably 30 to 80% by mass, when the volatile compound included in the sheet-shaped formed product before volatilization is 100% by mass. By setting the amount of the volatile compound volatilized in the above range, the primary sheet has moderate softness, the adhesiveness between the primary sheets also becomes good, and it becomes easy to obtain an appropriate thermally conductive sheet.

The amount volatilized can be adjusted by adjusting the heating temperature and the heating time at the time of curing. The heating temperature may be a temperature of, for example, about 65 to 100° C. In addition, the heating time is, for example, about 2 to 24 hours.

As described above, a primary sheet is obtained by curing the curable silicone composition included in the sheet-shaped formed product. In the primary sheet, the anisotropic filler is oriented along the plane direction as described above. After the primary sheet is obtained, the two films provided on the surfaces thereof may be peeled off.

The thickness of the primary sheet obtained by curing is preferably in the range of 0.1 to 10 mm. By setting the thickness of the primary sheet within the above range, the anisotropic filler 14 can be appropriately oriented in the plane direction by a shear force. In addition, by setting the thickness of the primary sheet to 0.1 mm or more, the primary sheet can be easily peeled off from the films. Further, by setting the thickness of the primary sheet to 10 mm or less, the primary sheet can be prevented from being deformed by its own weight. From these viewpoints, the thickness of the primary sheet is more preferably 0.3 to 5.0 mm.

The type OO hardness of the primary sheet is preferably 6 or more. By setting the type OO hardness to 6 or more, the primary sheet does not spread so much even if the primary sheets are pressurized when laminated, and a laminated block having a sufficient thickness can be produced. From such a viewpoint, the type OO hardness of the primary sheet is more preferably 10 or more and further preferably 15 or more.

In addition, from the viewpoint of securing the softness of the thermally conductive sheet obtained, the type OO hardness of the primary sheet is preferably 55 or less, more preferably 50 or less, and further preferably 40 or less.

<Step (4)>

The step (4) is a step of providing a plurality of the primary sheets obtained in the above step (2) and laminating the plurality of the primary sheets to adhere the plurality of the primary sheets to form a laminated block.

Figure 2:
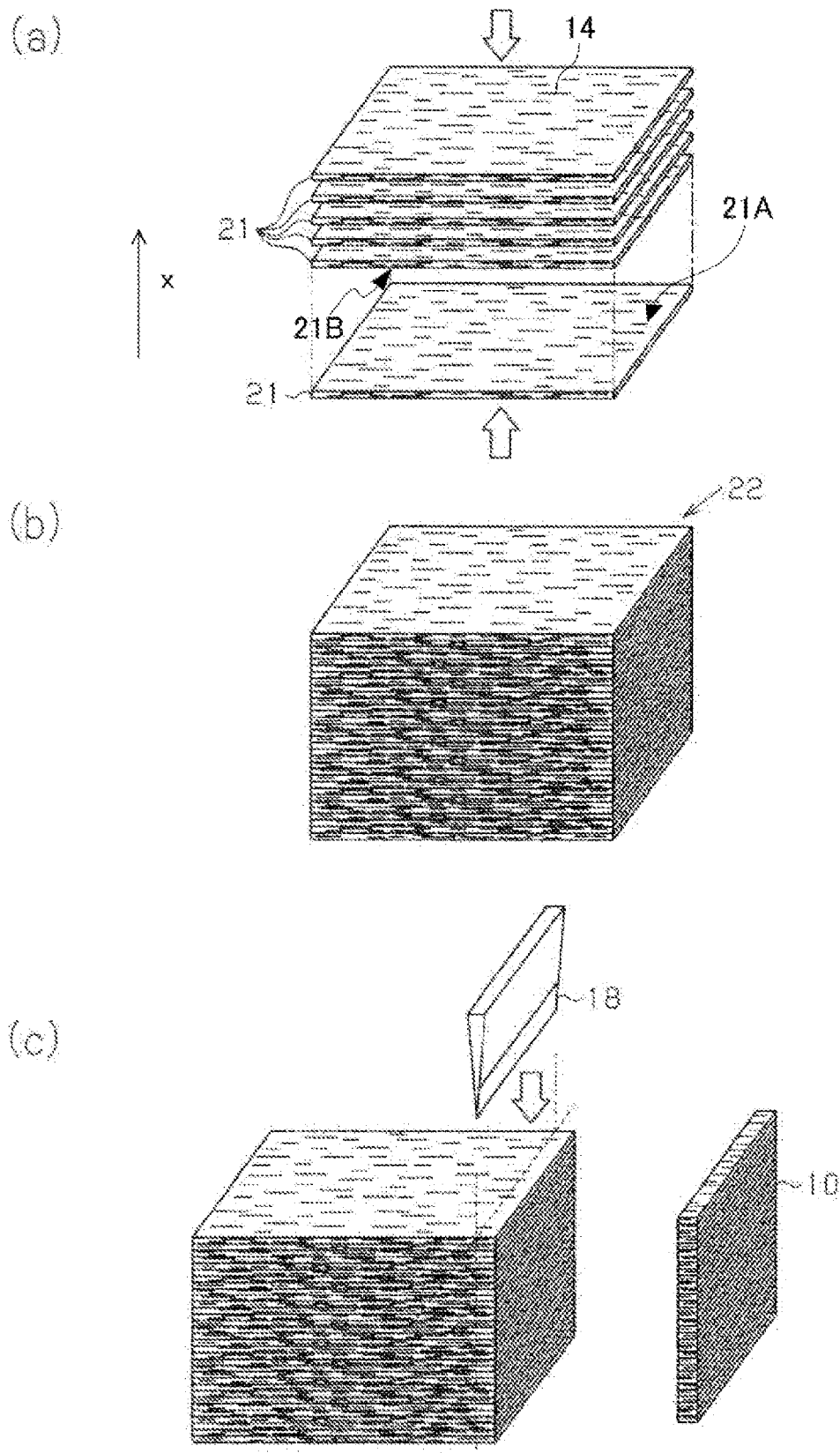
FIG. 2 is a schematic perspective view showing one example of a method for producing a thermally conductive sheet.

As shown in FIGS. 2(a) and 2(b), a plurality of primary sheets 21 are laminated such that the orientation directions of anisotropic fillers 14 are the same. Here, when the volatile compound is completely volatilized from the primary sheet highly filled with the thermally conductive filler, the surface tends to become smooth because of the exposure of the thermally conductive filler, and the adhesiveness has been found to be poor on such a surface. The primary sheet includes a certain amount of the volatile compound, and thus the surface of the primary sheet does not become smooth, and the plurality of the primary sheets are adhered by being laminated. Because of this, it is not necessary to use an adhesive or a primer in order to adhere the primary sheets to each other. If an adhesive, a primer, or the like is used, it may penetrate into the primary sheet to a certain depth, which may reduce the softness of the thermally conductive sheet, but the thermally conductive sheet of the present invention becomes good softness because it does not need to use an adhesive or a primer in the production process thereof.

The primary sheets 21 can be adhered only by overlaying these as described above, but in order to adhere these more firmly, the primary sheets 21 may be pressurized in the lamination direction x thereof. The pressurization may be carried out at a pressure such that the primary sheets 21 are not greatly deformed, and the primary sheets 21 can be pressurized, for example, using a roller or a press. As one example, when a roller is used, the pressure is preferably 0.3 to 3 kgf/50 mm.

The laminated primary sheets 21 may be suitably heated, for example, when pressurized, but it is preferable not to heat the laminated primary sheets 21 because they can be adhered without heating. Therefore, the temperature at the time of pressing is, for example, 0 to 50° C. and preferably about 10 to 40° C.

<Step (5)>

The step (5) is a step of cutting the laminated block obtained in the step (4) into a sheet shape along a lamination direction to obtain a thermally conductive sheet.

As shown in FIG. 2(c), the laminated block 22 is cut along the lamination direction x of the primary sheets 21 using a blade 18 to obtain a thermally conductive sheet 10. At this time, the laminated block 22 may be cut in a direction orthogonal to the orientation direction of the anisotropic filler 14. As the blade 18, for example, a double-edged blade or a single-edged blade such as a razor blade or a cutter knife, a round blade, a wire blade, or a saw blade can be used. The laminated block 22 is cut by a method such as force cutting, shearing, rotation, or sliding, using a blade 18.

From the viewpoint of volatilizing the remaining volatile compound, it is preferable to heat-treat the thermally conductive sheet obtained after cutting, and the heat treatment may be carried out under conditions of a heating temperature of 100 to 150° C. and a heating time of 2 to 48 hours.

The first production method including each step of the step (1), the step (2), the step (4), and the step (5) has been described above, and in the first production method, a step (3), which is a step of irradiating with a vacuum ultraviolet ray described in a second production method described later, may be provided between the steps (2) and the step (4). By carrying out the step (3), the adhesiveness between the primary sheets when the primary sheets are laminated in the step (4) is improved, and the thermally conductive sheet of the present invention can be more easily produced.

(Second Production Method)

The method for producing the thermally conductive sheet of the present invention is also preferably a second production method including each step of the following step (1), step (2'), step (3), step (4'), and step (5).

That is, the second production method of the thermally conductive sheet of the present invention is a method for producing a thermally conductive sheet, including:

a step (1) of forming a liquid composition including a curable silicone composition, a thermally conductive filler, and a volatile compound into a sheet shape to obtain a sheet-shaped formed product;

a step (2') of curing the curable silicone composition while volatilizing a part of the volatile compound included in the sheet-shaped formed product, to obtain a primary sheet;

a step (3) of providing a plurality of the primary sheets and irradiating at least one side of each of the primary sheets with a vacuum ultraviolet ray;

a step (4') of laminating the plurality of the primary sheets such that the one side irradiated with the vacuum ultraviolet ray is in contact with another of the primary sheets to adhere the plurality of the primary sheets to form a laminated block; and a step (5) of cutting the laminated block into a sheet shape along a lamination direction to obtain a thermally conductive sheet.

The step (1) is as described in the above first production method.

<Step (2')>

The step (2') is a step of curing the curable silicone composition while volatilizing a part of the volatile compound included in the sheet-shaped formed product obtained in the step (1), to obtain a primary sheet.

The primary sheet produced without volatilizing the volatile compound is too soft to be restorable, and when the primary sheets are laminated in the step (4'), the primary sheets are crushed and it becomes difficult to produce a thermally conductive sheet.

On the other hand, the primary sheets produced by completely volatilizing the volatile compound have poor adhesiveness between the primary sheets when the primary sheets are laminated in the step (4'), and as a result, it becomes difficult to produce a thermally conductive sheet.

The method for volatilizing a part of the volatile compound included in the sheet-shaped formed product is not particularly limited. For example, as in the above step (2), the volatile compound may be volatilized in a state in which the sheet-shaped formed product is disposed between two films at least one of which is a gas-permeable film, or the volatile compound may be volatilized in a state in which one side of the sheet-shaped formed product is in an open system. The state in which one side of the sheet-shaped formed product is in an open system is, for example, a state in which a film is provided on one side of the sheet-shaped formed product and nothing is provided on the other side. Specifically, in the step (1), the liquid composition may be applied onto a base material film to produce a sheet-shaped formed product, and the volatile compound may be volatilized by heating the sheet-shaped formed product in that state.

In the step (2'), the amount of the volatile compound volatilized is preferably 10 to 80% by mass, preferably 30 to 80% by mass, when the volatile compound included in the sheet-shaped formed product before volatilization is 100% by mass. By setting the amount of the volatile compound volatilized in the above range, the primary sheet has moderate softness, the adhesiveness between the primary sheets also becomes good, and it becomes easy to obtain an appropriate thermally conductive sheet.

The amount volatilized can be adjusted by adjusting the heating temperature and the heating time at the time of curing. The heating temperature may be a temperature of, for example, about 65 to 100° C. In addition, the heating time is, for example, about 2 to 24 hours.

<Step (3)>

The step (3) is a step of providing a plurality of the primary sheets obtained in the step (2') and irradiating at least one side of each of the primary sheets with a vacuum ultraviolet ray. In the step (3), VUV irradiation is applied to at least one side of each of the cured primary sheets. VUV is a vacuum ultraviolet ray, and means an ultraviolet ray having a wavelength of 10 to 200 μm. Examples of a light source of VUV include an excimer Xe lamp and an excimer ArF lamp.

The cured primary sheets include a silicone resin (organopolysiloxane) as described above, and when VUV irradiation is applied, the side irradiated with VUV is activated. By overlaying one of the primary sheets on another of the primary sheets such that the one side activated becomes an overlaying side, as described later, the primary sheets are firmly adhered to each other.

Although the principle thereof is not clear, it is presumed that when the silicone resin is irradiated with VUV, a C—Si bond of organopolysiloxane changes to a Si—O bond such as Si—OH, and by the Si—O bond, the primary sheets are firmly adhered to each other. That is, one of the primary sheets and another of the primary sheets (unit layers 13 and 13) are adhered by forming a bond between molecules of organopolysiloxane.

The VUV irradiation conditions are not particularly limited as long as the surface of the primary sheets can be activated, and VUV irradiation may be applied, for example, such that the integrated amount of light is 5 to 100 mJ/cm² and preferably the integrated amount of light is 10 to 50 mJ/cm².

<Step (4')>

The step (4') is a step of laminating the plurality of the primary sheets such that the one side irradiated with the vacuum ultraviolet ray is in contact with another of the primary sheets to adhere the plurality of the primary sheets to form a laminated block.

As shown in FIGS. 2(a) and 2(b), a plurality of primary sheets 21 are laminated such that the orientation directions of anisotropic fillers 14 are the same. Here, as described above, in each of the primary sheets 21, either one side of the overlaying sides that are in contact with each other may be irradiated with VUV in advance. Because one side is irradiated with VUV, the primary sheets 21 and 21 that are adjacent are adhered to each other by the one side activated. In addition, from the viewpoint of further improving the adhesiveness, both the overlaying sides are preferably irradiated with VUV.

That is, as shown in FIG. 2(a), the primary sheets 21 may be overlaid such that one side 21A irradiated with VUV is in contact with another of the primary sheets 21, and at this time, the other side 21B of the another of the primary sheets 21 in contact with the one side 21A is preferably also irradiated with VUV.

The primary sheets 21 can be adhered only by overlaying these as described above, but in order to adhere these more firmly, the primary sheets 21 may be pressurized in the lamination direction x thereof. The pressurization may be carried out at a pressure such that the primary sheets 21 are not greatly deformed, and can be pressurized, for example, using a roller or a press. As one example, when a roller is used, the pressure is preferably 0.3 to 3 kgf/50 mm.

The laminated primary sheets 21 may be suitably heated, for example, when pressurized, but it is preferable not to heat the laminated primary sheets 21 because the primary sheets 21 activated by VUV irradiation can be adhered without heating. Therefore, the temperature at the time of pressing is, for example, 0 to 50° C. and preferably about 10 to 40° C.

By carrying out the step (5) of cutting the laminated block obtained in the above step (4) into a sheet shape along a lamination direction to obtain a thermally conductive sheet, a thermally conductive sheet can be obtained. Details of the step (5) are as described in the above first production method.

Second Embodiment

Next, a thermally conductive sheet of a second embodiment of the present invention will be described with reference to FIG. 3.

Figure 3:
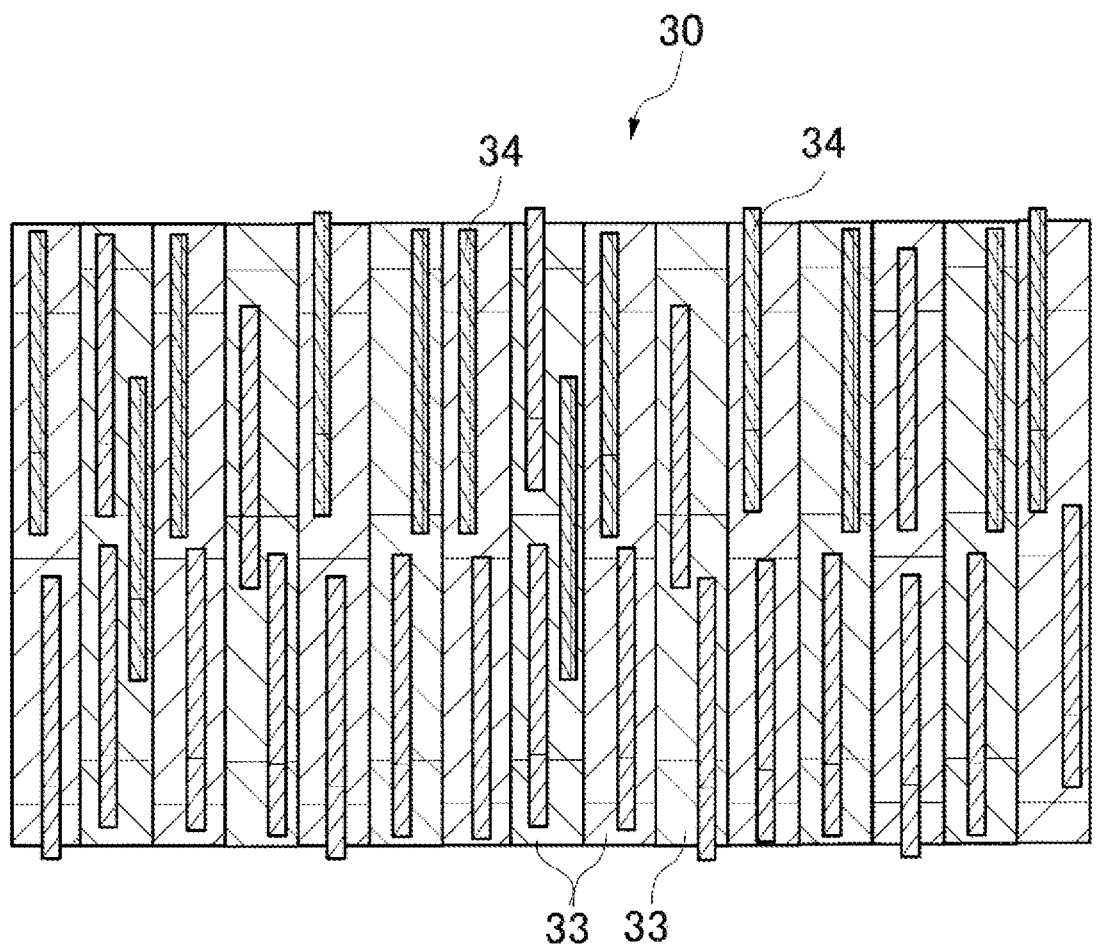
FIG. 3 is a schematic cross-sectional view showing a thermally conductive sheet of a second embodiment.

In the first embodiment, the thermally conductive sheet 10 contains the non-anisotropic filler 15 in addition to the anisotropic filler 14 as a thermally conductive filler, but the thermally conductive sheet 30 of the present embodiment does not contain a non-anisotropic filler, as shown in FIG. 3. That is, each unit layer 33 of the thermally conductive sheet of the second embodiment contains an anisotropic filler 34 oriented in the thickness direction of the sheet 30, but does not contain a non-anisotropic filler.

The other configurations of the thermally conductive sheet 30 of the second embodiment are the same as those of the thermally conductive sheet 10 of the first embodiment described above, except that no non-anisotropic filler is contained, and thus the description thereof will be omitted.

Also in the present embodiment, as in the first embodiment, in the thermally conductive sheet 20, the volume content of the silicone resin is 32% by volume or less, and the compressive load at a sheet area of 25.4 mm×25.4 mm when the thermally conductive sheet is 30% compressed from a perpendicular direction is 5.0 kgf or less. Because of this, the volume content of the thermally conductive filler can be increased, and thus the thermal conductivity is excellent and the softness is good, and the thermally conductive sheet can be compressed and used inside an electronic device or the like. In addition, the thermally conductive sheet 20 can be appropriately produced with almost no spreading of each of the unit layers 33 because of the pressure when laminating the unit layers 33.

The thermally conductive sheet of the present invention is not limited to the configurations of the first and second embodiments, and can have various embodiments. For example, in the first embodiment, the thermally conductive sheet contains both an anisotropic filler and a non-anisotropic filler as the thermally conductive filler, but the thermally conductive sheet may contain only a non-anisotropic filler without containing an anisotropic filler.

If the thermally conductive sheet does not contain an anisotropic filler, it is not necessary to apply a shear force in order to orient the anisotropic filler when forming the primary sheet, and the primary sheet may be formed by any method as long as the method can form the liquid composition into a sheet shape.

In the above description, an embodiment in which the unit layers in the thermally conductive sheet each have substantially the same composition has been described, but the compositions of each unit layer may be different from each other.

For example, in the first embodiment, any unit layers contains both an anisotropic filler and a non-anisotropic filler, but some unit layers may contain both an anisotropic filler and a non-isotropic filler, and some unit layers may contain either one of an anisotropic filler and a non-anisotropic filler.

In addition, for example, some unit layers may have only an anisotropic filler, and some unit layers may have only the non-anisotropic filler 15.

In addition, each unit layer does not need to have the same content of the thermally conductive filler, and the content of the thermally conductive filler in some unit layers may be made different from the content of the thermally conductive filler in other unit layers. In addition, the type of the thermally conductive filler in some unit layers may be made different from the type of the thermally conductive filler in other unit layers.

As described above, by suitably adjusting the presence/absence of the content, the content, the type, or the like of the thermally conductive filler in each unit layer, the thermal conductivity of some unit layers may be made higher than the thermal conductivity of other unit layers. In such a case, a unit layer having a high thermal conductivity and a unit layer having a low thermal conductivity may be disposed alternately, but do not need to be disposed alternately.

A configuration other than the thermally conductive filler may be changed for each unit layer. For example, the type of the silicone resin in some unit layers may be changed from the type of the silicone resin in other unit layers. In addition, the presence or absence of an additive component contained in some unit layers, the type or amount of the additive component, or the like may be made different from that in other unit layers.

For example, by making at least a part of the type or amount of the silicone resin and the type or amount of the thermally conductive filler in some unit layers different from those of other unit layers, the hardness (type OO hardness) of some unit layers may be made different from the hardness of the other unit layers.

EXAMPLES

Hereinafter, the present invention will be described in more detail with reference to Examples, but the present invention is not limited to these Examples at all.

In the present Examples, physical properties of the thermally conductive sheet were evaluated by the following methods.

[Compressive Load]
The compressive load (kgf) of the thermally conductive sheet at a sheet area of 25.4 mm×25.4 mm was measured. The compressive load was measured by measuring the load when the thermally conductive sheet was 30% compressed from a direction perpendicular to an adhesion plane on which a plurality of unit layers were adhered to each other.

[Thermal Conductivity]
The thermal conductivity of the thermally conductive sheet was measured by the method according to ASTM D5470-06.

[Puncture Load]
The liquid composition was defoamed and next, 30 g of the liquid composition was introduced into a cylindrical container having a diameter of 25 mm. Next, a puncture rod having a disk-shaped member having a diameter of 3 mm at the tip was pressed against the liquid composition introduced into the container from the tip side of the puncture rod at a rate of 10 mm/min, and the load (gf) when the tip of the puncture rod reached a depth of 12 mm below the liquid level was measured. The measurement was carried out at 25° C.

In the present Examples, thermally conductive sheets were produced using each of the following components.

[Curable Silicone Composition]
Addition-reaction type organopolysiloxane including an alkenyl group-containing organopolysiloxane as the base resin and a hydrogen organopolysiloxane as the curing agent

[Anisotropic Fillers]
Boron nitride . . . Flaky, average particle size of 30 µm, aspect ratio of 10 to 15
Graphitized carbon fiber . . . Fibrous, average fiber length of 100 µm, aspect ratio of 10, thermal conductivity of 500 W/m·k
Flaky carbon powder . . . Flaky, average particle size of 130 µm, aspect ratio of 10 to 15, thermal conductivity of 100 W/m·k

[Non-Anisotropic Fillers]
Aluminum oxide A . . . Average particle size of 3 µm, spherical, aspect ratio of 1.0
Aluminum oxide B . . . Average particle size of 0.5 µm, spherical, aspect ratio of 1.0

[Volatile compound]
n-Decyltrimethoxysilane . . . The temperature T1 at which the weight loss when the temperature is raised under a condition of 2° C./min in thermogravimetric analysis is 90% is 187° C.

Example 1

A total of 110 parts by mass of an alkenyl group-containing organopolysiloxane (base resin) and a hydrogen organopolysiloxane (curing agent) as the curable silicone composition, 200 parts by mass of boron nitride (flaky, average particle size of 20 µm) as the anisotropic filler, 430 parts by mass of aluminum oxide A (spherical, average particle size of 3 µm, aspect ratio of 1.0) and 200 parts by mass of aluminum oxide B (spherical, average particle size of 0.5 µm, aspect ratio of 1.0) as the non-anisotropic filler, and 35 parts by mass of n-decyltrimethoxysilane as the volatile compound were mixed to obtain a liquid composition.

The liquid composition was applied in one direction onto a base material film including a gas-permeable film ("TPX film" manufactured by Mitsui Chemicals, Inc.) at 25° C. using a bar coater as a coating applicator to obtain a sheet-shaped formed product. The anisotropic filler had a major axis facing in the application direction and a minor axis facing in the normal direction of the application side. Next, a gas-permeable film ("TPX film" manufactured by Mitsui Chemicals, Inc.) was placed on a surface of the sheet-shaped formed product on the side not having the base material film. Then, the sheet-shaped formed product was heated at 80° C. for 16 hours in a state in which the sheet-shaped formed product was sandwiched between the two films to cure the curable silicone composition included in the sheet-shaped formed product while volatilizing a part of the volatile compound, to obtain a primary sheet having a thickness of 1.5 mm.

Both sides of the obtained primary sheet were irradiated with VUV using a VUV irradiation apparatus (trade name: Excimer MINI, manufactured by Hamamatsu Photonics K.K.) under conditions of an integrated amount of light of 20 mJ/cm$^2$ on the surface of the primary sheet at room temperature (25° C.) in the atmosphere. Next, 100 primary sheets irradiated with VUV were laminated and pressurized using a roller at a pressure of 1.6 kgf/50 mm in an environment of 25° C. to obtain a laminated block. The obtained laminated block was sliced using a cutter blade parallel to the lamination direction and perpendicularly to the orientation direction of the anisotropic filler to obtain a thermally conductive sheet having a thickness of 2 mm and having a thickness of each unit layer of 1500 μm.

Each evaluation result is shown in Table 1. The "Proportion of curable silicone composition in liquid composition excluding volatile compound" in the section of the liquid composition shown in Table 1 is equivalent to the proportion (% by volume) of the silicone resin in the thermally conductive sheet when the thermally conductive sheet is formed using the composition.

Examples 2 to 16

Thermally conductive sheets were obtained in the same manner as in Example 1 except that the composition of the liquid composition was changed as shown in Table 1 or Table 2.

Example 17

A thermally conductive sheet was obtained in the same manner as in Example 1 except that the thickness of the primary sheet was changed to 9 mm.

Comparative Examples 1, 3, and 5

Thermally conductive sheets were obtained in the same manner as in Example 1 except that the composition of the liquid composition was changed as shown in Table 3.

Comparative Examples 2, 4, and 6

The composition of the liquid composition was changed as shown in Table 3, but the liquid composition became powdery and no primary sheet was able to be formed.

TABLE 1

| | | | | Examples | | | | | | | | |
|---|---|---|---|---|---|---|---|---|---|---|---|---|
| | | | | 1 | 2 | 3 | 4 | 5 | 6 | 7 | 8 | 9 |
| Liquid composition | Curable silicone composition | Addition-reactive silicone | Parts by mass | 110 | 110 | 110 | 110 | 110 | 110 | 110 | 110 | 110 |
| | Boron nitride | Flaky, 30 μm | | 200 | 200 | 260 | 245 | 245 | 245 | 245 | 245 | 245 |
| | Graphitized carbon fiber | Fibrous, fiber length of 100 μm | | — | — | — | — | — | — | — | — | — |
| | Flaky carbon powder | Flaky, 130 μm | | — | — | — | — | — | — | — | — | — |
| | Aluminum oxide A | Spherical, 3 μm | | 430 | 350 | 350 | 350 | 350 | 350 | 350 | 350 | 350 |
| | Aluminum oxide B | Spherical, 0.5 μm | | 200 | 280 | 200 | 200 | 200 | 200 | 200 | 200 | 200 |
| | Volatile compound | n-Decyltrimethoxysilane | | 35 | 35 | 35 | 32 | 29 | 26 | 20 | 15 | 10 |
| | Proportion of curable silicone composition in liquid composition excluding volatile compound | | % by volume | 30.8 | 30.8 | 30.2 | 30.8 | 30.8 | 30.8 | 30.8 | 30.8 | 30.8 |
| Thermally conductive sheet | Silicone resin | Addition-reactive silicone | % by volume | 30.8 | 30.8 | 30.2 | 30.8 | 30.8 | 30.8 | 30.8 | 30.8 | 30.8 |
| | Boron nitride | Flaky, 20 μm | | 24.9 | 24.9 | 31.8 | 30.5 | 30.5 | 30.5 | 30.5 | 30.5 | 30.5 |
| | Graphitized carbon fiber | Fibrous, fiber length of 100 μm | | — | — | — | — | — | — | — | — | — |
| | Flaky carbon powder | Flaky, 130 μm | | — | — | — | — | — | — | — | — | — |
| | Aluminum oxide A | Spherical, 3 μm | | 30.2 | 24.6 | 24.2 | 24.6 | 24.6 | 24.6 | 24.6 | 24.6 | 24.6 |
| | Aluminum oxide B | Spherical, 0.5 μm | | 14.1 | 19.7 | 13.8 | 14.1 | 14.1 | 14.1 | 14.1 | 14.1 | 14.1 |
| Evaluations | Puncture load | | gf | 28.5 | 27.2 | 20.9 | 15.0 | 30.8 | 23.2 | 36.8 | 59.6 | 116.3 |
| | Thermal conductivity | ASTM D5470-06 | W/mK | 11.4 | 11.2 | 12.5 | 12.5 | 12.4 | 12.6 | 12.3 | 12.4 | 11.9 |
| | Compressive load | □ 25.4 mm, 30% Compression | kgf | 1.2 | 0.7 | 2.4 | 2.2 | 2.6 | 2.6 | 2.5 | 2.6 | 2.7 |

TABLE 2

| | | | | Examples | | | | | | | |
|---|---|---|---|---|---|---|---|---|---|---|---|
| | | | | 10 | 11 | 12 | 13 | 14 | 15 | 16 | 17 |
| Liquid composition | Curable silicone composition | Addition-reactive silicone | Parts by mass | 100 | 100 | 100 | 110 | 110 | 110 | 110 | 110 |
| | Boron nitride | Flaky, 30 μm | | 180 | — | — | 245 | 245 | 245 | 245 | 200 |
| | Graphitized carbon fiber | Fibrous, fiber length of 100 μm | | — | 120 | — | — | — | — | — | — |
| | Flaky carbon powder | Flaky, 130 μm | | — | — | 120 | — | — | — | — | — |
| | Aluminum oxide A | Spherical, 3 μm | | 350 | 500 | 500 | 350 | 350 | 350 | 350 | 430 |
| | Aluminum oxide B | Spherical, 0.5 μm | | 200 | 150 | 150 | 240 | 320 | 440 | 480 | 200 |
| | Volatile compound | n-Decyltrimethoxysilane | | 26 | 26 | 26 | 15 | 15 | 15 | 15 | 35 |
| | Proportion of curable silicone composition in liquid composition excluding volatile compound | | % by volume | 31.4 | 31.5 | 31.5 | 30.0 | 28.4 | 26.4 | 25.7 | 30.8 |
| Thermally conductive sheet | Silicone resin | Addition-reactive silicone | % by volume | 31.4 | 31.5 | 31.5 | 30.0 | 28.4 | 26.4 | 25.7 | 30.8 |
| | Boron nitride | Flaky, 20 μm | | 25.1 | — | — | 29.7 | 28.1 | 26.1 | 25.5 | 24.9 |
| | Graphitized carbon fiber | Fibrous, fiber length of 100 μm | | — | 17.2 | — | — | — | — | — | — |
| | Flaky carbon powder | Flaky, 130 μm | | — | — | 17.2 | — | — | — | — | — |
| | Aluminum oxide A | Spherical, 3 μm | | 27.6 | 39.5 | 39.5 | 23.9 | 22.7 | 21.0 | 20.6 | 30.2 |
| | Aluminum oxide B | Spherical, 0.5 μm | | 15.8 | 11.9 | 11.9 | 16.4 | 20.8 | 26.5 | 28.2 | 14.1 |
| Evaluations | Puncture load | | gf | 18.5 | 13.0 | 16.7 | 40.7 | 32.6 | 25.1 | 49.4 | 28.3 |
| | Thermal conductivity | ASTM D5470-06 | W/mK | 10.5 | 13.5 | 13.9 | 12.5 | 12.8 | 12.4 | 12.5 | 11.5 |
| | Compressive load | ☐ 25.4 mm, 30% Compression | kgf | 1.2 | 1.6 | 2.8 | 2.0 | 1.7 | 1.5 | 1.6 | 1.1 |

TABLE 3

| | | | | Comparative Examples | | | | | |
|---|---|---|---|---|---|---|---|---|---|
| | | | | 1 | 2 | 3 | 4 | 5 | 6 |
| Liquid composition | Curable silicone composition | Addition-reactive silicone | Parts by mass | 100 | 100 | 100 | 100 | 100 | 100 |
| | Boron nitride | Flaky, 30 μm | | 180 | 180 | — | — | — | — |
| | Graphitized carbon fiber | Fibrous, fiber length of 100 μm | | — | — | 120 | 120 | — | — |
| | Flaky carbon powder | Flaky, 130 μm | | — | — | — | — | 120 | 120 |
| | Aluminum oxide A | Spherical, 3 μm | | 500 | 350 | 500 | 500 | 500 | 500 |
| | Aluminum oxide B | Spherical, 0.5 μm | | — | 150 | — | 150 | — | 150 |
| | Volatile compound | n-Decyltrimethoxysilane | | — | — | — | — | — | — |
| | Proportion of curable silicone composition in liquid composition excluding volatile compound | | % by volume | 32.7 | 32.7 | 35.7 | 31.5 | 35.7 | 31.5 |
| Thermally conductive sheet | Silicone resin | Addition-reactive silicone | % by volume | 32.7 | | 35.7 | | 35.7 | |
| | Boron nitride | Flaky, 20 μm | | 26.2 | — | — | | — | |
| | Graphitized carbon fiber | Fibrous, fiber length of 100 μm | | — | | 19.5 | | — | |
| | Flaky carbon powder | Flaky, 130 μm | | — | | — | | 19.5 | |
| | Aluminum oxide A | Spherical, 3 μm | | 41.1 | | 44.8 | | 44.8 | |
| | Aluminum oxide B | Spherical, 0.5 μm | | — | | — | | — | |
| Evaluations | Puncture load | | gf | 30.2 | — | 18.0 | — | 45.2 | — |
| | Thermal conductivity | ASTM D5470-06 | W/mK | 7.0 | — | 11.0 | — | 10.1 | — |
| | Compressive load | ☐ 25.4 mm, 30% Compression | kgf | 2.1 | — | 1.8 | — | 3.6 | — |

In the thermally conductive sheets of Examples 1 to 17, the volume content of the silicone resin was 32% by volume or less, and because of this, the content of the thermally conductive filler was high, and the thermally conductive sheets showed a high thermal conductivity. Further, the loads when the thermally conductive sheets were 30% compressed were 5.0 kgf or less, with the result that the softness was also good. As described above, it is considered that the thermally conductive sheets having a good balance of physical properties were obtained by using a liquid composition including a volatile compound and going through a predetermined production step.

On the other hand, in the thermally conductive sheets of Comparative Examples 1, 3, and 5, the volume content of the silicone resin exceeded 32% by volume, and because of this, the content of the thermally conductive filler was low, and the thermal conductivity was lower than that of the Examples in which the same anisotropic filler was blended. In addition, in Comparative Examples 2, 4, and 6, no primary sheet was able to be formed, and no thermally conductive sheet was able to be obtained. It is presumed that this is because the Comparative Examples, unlike the Examples, used no volatile compound in the liquid composition, and thus no appropriate compound was formed.

REFERENCE SIGNS LIST

10, 30 Thermally conductive sheet
10A, 21A One side
10B, 21B The other side
11 Silicone resin
13, 33 Unit layer
14, 34 Anisotropic filler
15 Non-anisotropic filler
18 Blade
21 Primary sheet
22 Laminated block

The invention claimed is:

1. A thermally conductive sheet comprising a plurality of unit layers, each comprising a silicone resin and a thermally conductive filler, the plurality of unit layers being laminated such that the plurality of unit layers are adhered to each other, wherein
 a volume content of the silicone resin is 32% by volume or less,
 wherein the thermally conductive filler comprises an anisotropic filler,
 wherein the anisotropic filler is oriented in a thickness direction of the sheet,
 wherein the anisotropic filler comprises a flaky material,
 wherein a normal direction of a flaky plane of the flaky material faces in a lamination direction of the plurality of unit layers,
 wherein a content of the flaky material is 120 parts by mass or more per 100 parts by mass of the silicone resin, and
 a compressive load at a sheet area of 25.4 mm×25.4 mm when the thermally conductive sheet is 30% compressed from a direction perpendicular to an adhesion plane on which the plurality of unit layers are adhered to each other is 7.0 kgf or less.

2. The thermally conductive sheet according to claim 1, wherein the plurality of unit layers are laminated along one direction along a plane direction of the sheet.

3. The thermally conductive sheet according to claim 1, wherein the thermally conductive filler further comprises a non-anisotropic filler.

4. The thermally conductive sheet according to claim 1, wherein the anisotropic filler further comprises a fibrous material.

5. The thermally conductive sheet according to claim 1, wherein the unit layers that are adjacent are firmly adhered directly to each other.

6. The thermally conductive sheet according to claim 1, wherein the anisotropic filler is boron nitride, and a content of the boron nitride is 180 parts by mass or more per 100 parts by mass of the silicone resin.

7. The thermally conductive sheet according to claim 1, wherein the thermal conductivity of the thermally conductive sheet in the thickness direction is 10.5 W/(m·K) or more.

* * * * *